(12) United States Patent
Venkateswaran et al.

(10) Patent No.: US 7,212,946 B1
(45) Date of Patent: May 1, 2007

(54) METHOD, SYSTEM, AND PROGRAM PRODUCT FOR ACCOMMODATING SPATIALLY-CORRELATED VARIATION IN A PROCESS PARAMETER

(75) Inventors: Natesan Venkateswaran, Hopewell Junction, NY (US); Chandramouli Visweswariah, Croton-on-Hudson, NY (US); Lizheng Zhang, Madison, WI (US); Vladimir Zolotov, Putnam Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/272,234

(22) Filed: Nov. 10, 2005

(51) Int. Cl.
*G06F 17/18* (2006.01)
*G06F 15/00* (2006.01)
*G06F 19/00* (2006.01)

(52) U.S. Cl. ...................................... 702/179; 194/196
(58) Field of Classification Search .................. 702/179
See application file for complete search history.

(56) References Cited

OTHER PUBLICATIONS

Agarwal et. al. "Statistical Timing Analysis for Intra-Die Process Variations with Spatial Correlations," ICCAD '03 Nov. 11-13, 2003, San Jose, California, pp. 900-907.*
Khandelwal et al., "A General Framework for Accurate Statistical Timing Analysis Considering Correlations", DAC 2005, Jun. 13-17, 2005, Anaheim, California, pp. 89-94.
Agarwal et al., "Statistical Timing Analysis for Intra-Die Process Variations with Spatial Correlations", ICCAD '03, Nov. 11-13, 2003, San Jose, California, pp. 900-907.
Zhang et al., "Statistical Timing Analysis with Extended Pseudo-Canonical Timing Model", Proceedings of the Design, Automation and Test in Europe Conference and Exhibition (DATE '05).
Agarwal, A. et al., "Statistical Delay Computation Considering Spatial Correlations," ACM/IEEE Asia-Pacific Design Automation Conference (ASP-DAC), Jan. 2003, pp. 271-276.
Chang, H. et al., "Statistical Timing Analysis Considering Spatial Correlations Using a Single Pert-Like Traversal," Proceedings of the IEEE/ACM International Conference on Computer-Aided Design, 2003, pp. 621-625.
Zhan, Y. et al., "Correlation-Aware Statistical Timing Analysis with Non-Gaussian Delay Distributions," DAC, Jun. 13-17, 2005, California, USA, pp. 77-82.

* cited by examiner

*Primary Examiner*—John Barlow
*Assistant Examiner*—Sujoy Kundu
(74) *Attorney, Agent, or Firm*—Raphael Perez-Pineiro; Hoffman, Warnick & D'Alessandro LLC (57) ABSTRACT

The invention provides a method, system, and program product for accommodating spatially-correlated variation in a process parameter during statistical timing of a circuit. In one embodiment, the method includes dividing an area of the circuit into a plurality of grid cells; associating an independent random variable with each of the plurality of grid cells; and expressing at least one spatially-correlated parameter of a first grid cell as a function of the random variables associated with the first grid cell and at least one neighboring grid cell.

17 Claims, 12 Drawing Sheets

METHOD, SYSTEM, AND PROGRAM PRODUCT FOR ACCOMMODATING SPATIALLY-CORRELATED VARIATION IN A PROCESS PARAMETER

BACKGROUND OF THE INVENTION

1. Technical Field

The invention relates generally to statistical timing of a circuit, and more particularly, to a method, system, and program product for accommodating spatially-correlated variation in one or more process parameters during statistical timing of a circuit.

2. Background Art

As the sizes of transistors and interconnects in integrated circuits have decreased, variabilities in process parameters have led to corresponding increases in the difficulty of modeling and predicting circuit performance. Variations in process parameters can be inter-die variations (i.e., variations from die to die) or intra-die variations (i.e., variations within a single chip). Inter-die variations affect all components on a single chip similarly, while intra-die variations affect similar components on a single chip differently.

Statistical static timing analysis (SSTA) has become a widely-recognized technique for predicting statistical timing characteristics of digital circuits. Various approaches to SSTA are known, and include path-based, block-based, bounding, parameterized, and Monte-Carlo methods. A particularly promising technique is parameterized block-based SSTA, which models variation in gate delays, arrival times, and required times as a linear function of Gaussian independent sources of variation in process parameters. As such, parameterized block-based SSTA accommodates both independent and globally-correlated variations with speed and accuracy. The technique has also been used with non-Gaussian distributions.

However, the approaches to parameterized block-based SSTA to date are not problem-free. For example, the quad tree approach of Agarwal et al., ACM/IEEE Asia-Pacific Design Automation Conference (ASP-DAC), January 2003, pp. 271–276, assumes that a gate delay is represented as a linear combination of independent variables corresponding to cells of hierarchical rectangular grids, wherein the overlap of the grids models spatial correlation of the gate delays. This approach assumes that the coefficients of this linear combination are known. It is not clear, however, how these coefficients are computed in modeling a given spatial variation.

The approach of Chang et al., Proceedings of the IEEE/ACM International Conference on Computer-Aided Design, 2003, pp. 621–625, is also unsatisfactory. Using a rectangular grid superimposed onto a circuit, this approach assumes that a correlation matrix is known for gates situated in different grid cells. Principal component analysis (PCA) is then used to represent gate delays as linear functions of uncorrelated parameters. However, such an approach presents computational difficulties. For example, in a 10 mm by 10 mm chip having an effective correlation distance of 100 microns, a grid according to the approach of Chang et al. requires an eigenvalue decomposition (EVD) or singular value decomposition (SVD) of a 10,000 by 10,000 covariance matrix. Such decomposition is computationally expensive.

In addition, in the example above, gates separated by 200 microns or more are not correlated. As a result, modeling variation in such a chip requires at least 2500 (i.e., 50 by 50) independent random variables. Due to the number of uncorrelated variables, PCA cannot reduce the number of independent variables to fewer than 2500. Thus, using the PCA approach of Chang et al., large chips having relatively small correlation distances require a very large matrix and the computation of a prohibitively large number of eigenvalues and eigenvectors.

Other known approaches, whereby correlation coefficients are computed directly from a correlation matrix, are similarly unsatisfactory. First, such approaches require multiplication of the correlation matrix and canonical forms. This is both computationally expensive and adversely affects the efficiency of parameterized block-based SSTA. Second, the use of linear forms of delays, arrival times, and required times with correlated terms complicates other necessary operations, such as the computation of standard deviations, controlling and pruning small terms, reporting results, etc.

Accordingly, a need exists for a method for accommodating spatially-correlated variation in one or more process parameters during statistical timing of a circuit that does not suffer the deficiencies of the approaches described above.

SUMMARY OF THE INVENTION

The invention provides a method, system, and program product for accommodating spatially-correlated variation in a process parameter during statistical timing of a circuit. In one embodiment, the method includes dividing an area of the circuit into a plurality of grid cells; associating an independent random variable with each of the plurality of grid cells; and expressing at least one spatially-correlated parameter of a first grid cell as a function of the independent random variables associated with the first grid cell and at least one neighboring grid cell.

A first aspect of the invention provides a method for accommodating spatially-correlated variation in a process parameter during statistical timing of a circuit, the method comprising: dividing an area of the circuit into a plurality of grid cells; associating an independent random variable with each of the plurality of grid cells; and expressing at least one spatially-correlated parameter of a first grid cell as a function of the independent random variables associated with the first grid cell and at least one neighboring grid cell.

A second aspect of the invention provides a system for accommodating spatially-correlated variation in a process parameter during statistical timing of a circuit, the system comprising: a system for dividing an area of the circuit into a plurality of grid cells; a system for associating an independent random variable with each of the plurality of grid cells; and a system for expressing at least one spatially-correlated parameter of a first grid cell as a function of the independent random variables associated with the first grid cell and at least one neighboring grid cell.

A third aspect of the invention provides a program product stored on a computer-readable medium, which when executed, accommodates spatially-correlated variation in a process parameter during statistical timing of a circuit, the program product comprising: program code for dividing an area of the circuit into a plurality of grid cells; program code for associating an independent random variable with each of the plurality of grid cells; and program code for expressing at least one spatially-correlated parameter of a first grid cell as a function of the independent random variables associated with the first grid cell and at least one neighboring grid cell.

A fourth aspect of the invention provides a method for deploying an application for accommodating spatially-correlated variation in a process parameter during statistical timing of a circuit, comprising: providing a computer infrastructure being operable to: divide an area of the circuit into a plurality of grid cells; associate an independent random variable with each of the plurality of grid cells; and express at least one spatially-correlated parameter of a first grid cell as a function of the independent random variables associated with the first grid cell and at least one neighboring grid cell.

A fifth aspect of the invention provides computer software embodied in a propagated signal for accommodating spatially-correlated variation in a process parameter during statistical timing of a circuit, the computer software comprising instructions to cause a computer system to perform the following functions: divide an area of the circuit into a plurality of grid cells; associate an independent random variable with each of the plurality of grid cells; and express at least one spatially-correlated parameter of a first grid cell as a function of the independent random variables associated with the first grid cell and at least one neighboring grid cell.

A sixth aspect of the invention provides a business method for accommodating spatially-correlated variation in a process parameter during statistical timing of a circuit.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

As indicated above, the invention provides a method, system, and program product for accommodating spatially-correlated variation in one or more process parameters during statistical timing of a circuit.

Figure 1:
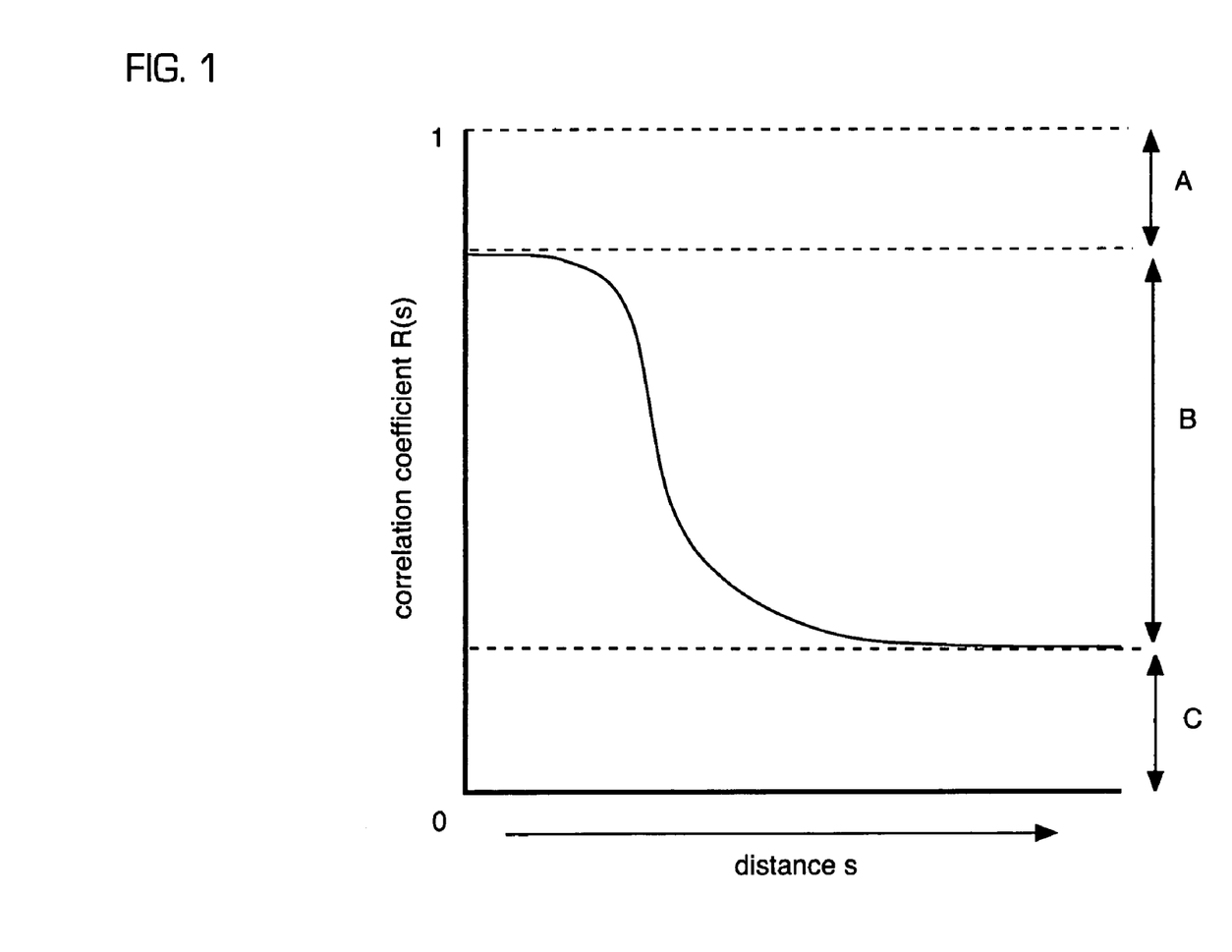
FIG. 1 shows a graph of a correlation coefficient as a function of a distance between circuit components.

Turning to the drawings, FIG. 1 shows a graph of variation in a process parameter as a function of the distance between two circuit components (e.g., transistors, etc.). As can be seen, as distance (s) increases, the correlation coefficient R(s) decreases. However, even when the distance between the circuit components is very small, R(s) does not necessarily equal 1. This is due to an independent (uncorrelated) component of the variation in the process parameter (i.e., a component responsible for independent or uncorrelated variation), represented by portion A, that causes R(s) to be less than 1, even when two circuit components are adjacent to each other. At the same time, even as the distance between the components increases to a very great distance, R(s) does not necessarily decrease to zero. This is due to a global component of the variation in the process parameter, represented by portion C, which affects all circuit components similarly, regardless of the distance between them. Methods of modeling and accommodating the independent and global components of process parameter variation are known and are referenced here only as they relate to the spatially-correlated component of process parameter variation, represented by portion B, the object of the present invention.

Figure 2:
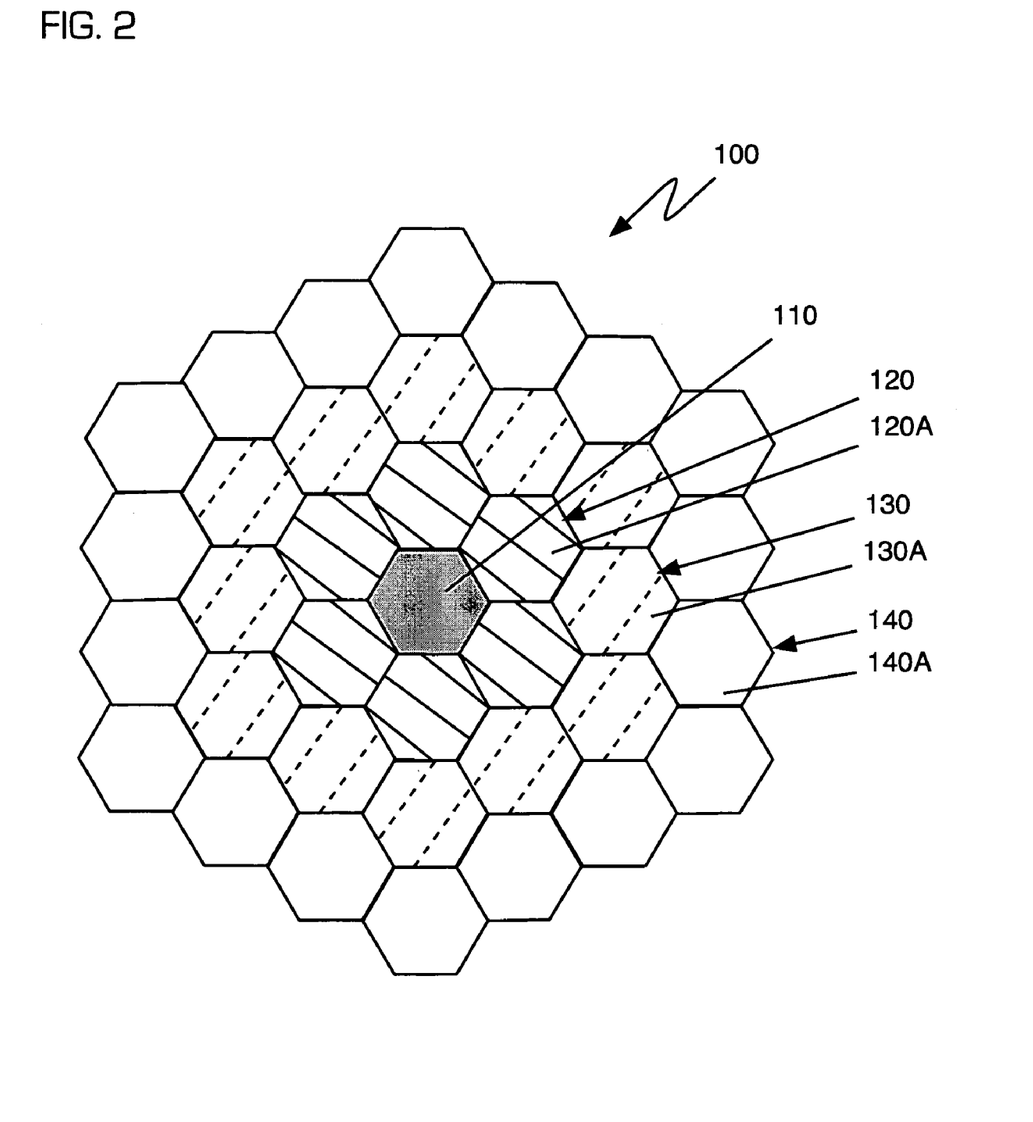
FIG. 2 shows an illustrative hexagonal grid pattern according to the invention.

Referring now to FIG. 2, a grid 100 according to the invention is shown, suitable for superimposition onto a chip. As noted above, the superimposition of a grid onto a chip is known in the art. Agarwal et al. and Chang et al. do so. However, unlike known methods, which generally utilize rectangular or other anisotropic shapes, the grid 100 of the present invention preferably includes hexagonal cells 110, 120A, 130A, 140A. The use of hexagonal cells ensures that all neighboring cells are in the same relative position to the central cell and therefore are more suitable for modeling isotropic spatial variation. That is, the relationships of each cell to its neighboring cells in a grid of hexagonal cells are identical. As noted, the cells of the grid 100 of the present invention are preferably hexagonal, although this is not necessary. Other grids consisting of isotropic shapes or even anisotropic shapes may be employed in practicing the invention. The grid may be regular or irregular, hierarchical or flat.

FIG. 2 shows various spatially-defined relationships among the cells of grid 100. Beginning with a cell of interest 110, other cells in grid 100 are defined according to their distance from cell 110. Cell 110 may be of interest, for example, because it contains a gate, the delay of which is to be modeled for timing purposes. Any other gate in cell 110 is said to be a zero-degree neighbor of the gate of interest. A ring 120 of first degree neighboring cells is located immediately adjacent to cell 110, with each cell of ring 120 (e.g., cell 120A) contacting cell 110. Next, a ring 130 of second degree neighboring cells is located immediately adjacent to ring 120, each cell of ring 130 (e.g., cell 130A) contacting a cell of ring 120 and being separated from cell 110 by an intervening cell (e.g., 120A). Next, a ring 140 of third degree neighboring cells is located immediately adjacent to ring 130, each cell of ring 140 (e.g., cell 140A) contacting a cell of ring 130 and being separated from cell 110 by two intervening cells (e.g., 120A, 130A). This scheme may be continued for any number of degrees of neighboring cells. As will be described in greater detail below, it is the modeling of the relationship between two or more cells of interest, and, in particular, the neighboring cells that they share, that enables the accommodation of spatially-correlated variation according to the present invention. For example, in FIG. 2, if cell 110 contained two gates, each gate would share with the other gate one common zero-degree cell (cell 110 itself) and six common first degree immediately neighboring cells (the six cells of ring 120).

Figure 3:
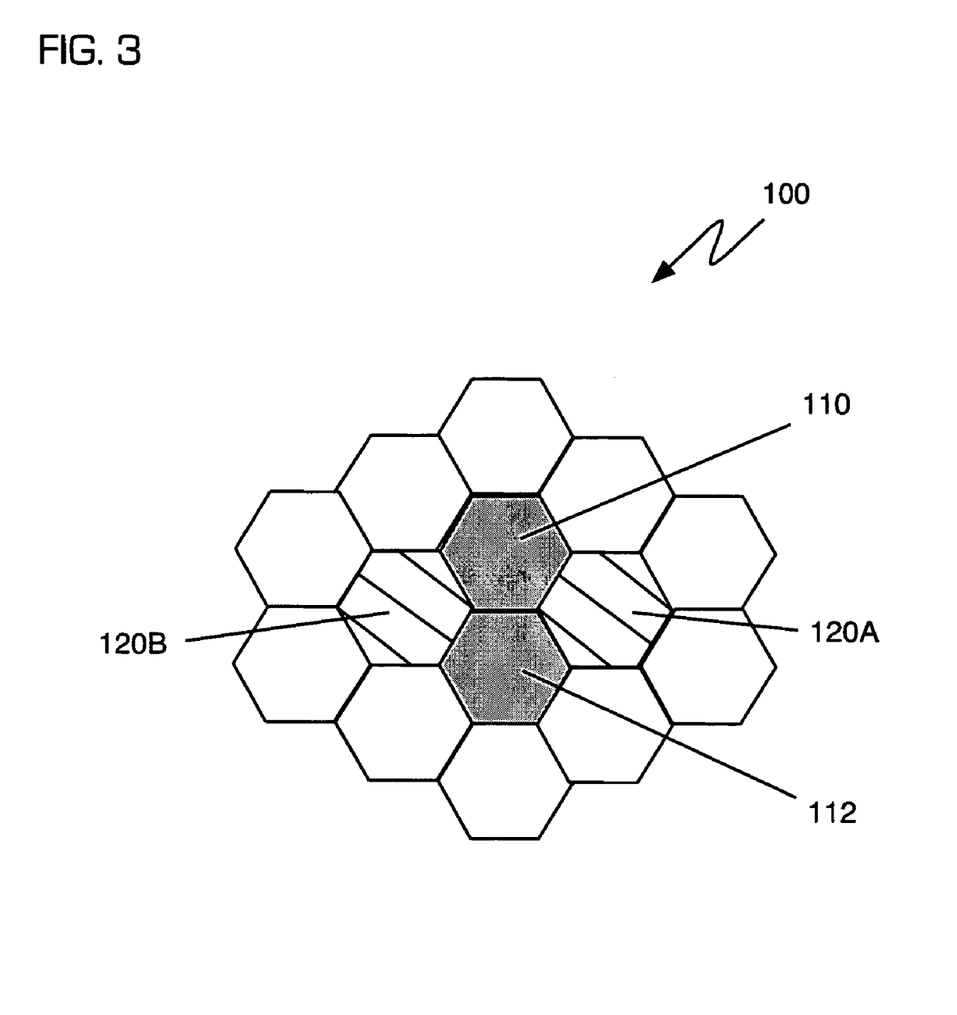
FIGS. 3–6 show various spatial relationships between cells in the hexagonal grid pattern of FIG. 2.
Figure 4:
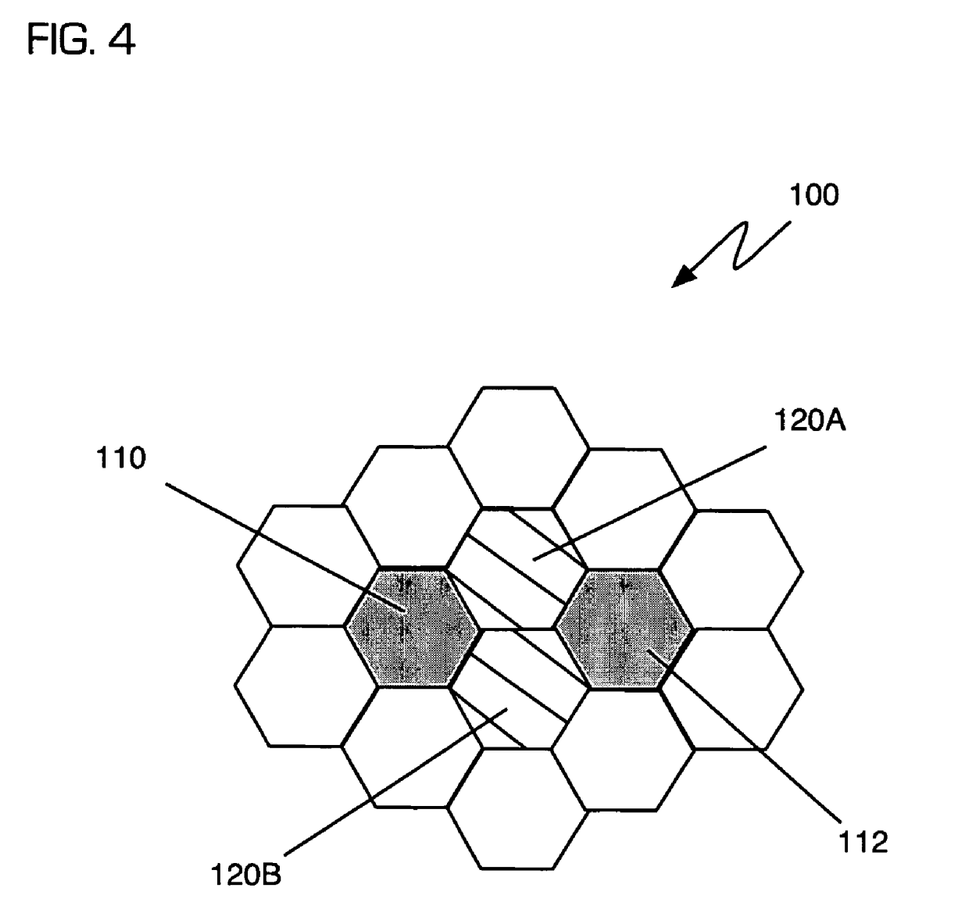
Figure 5:
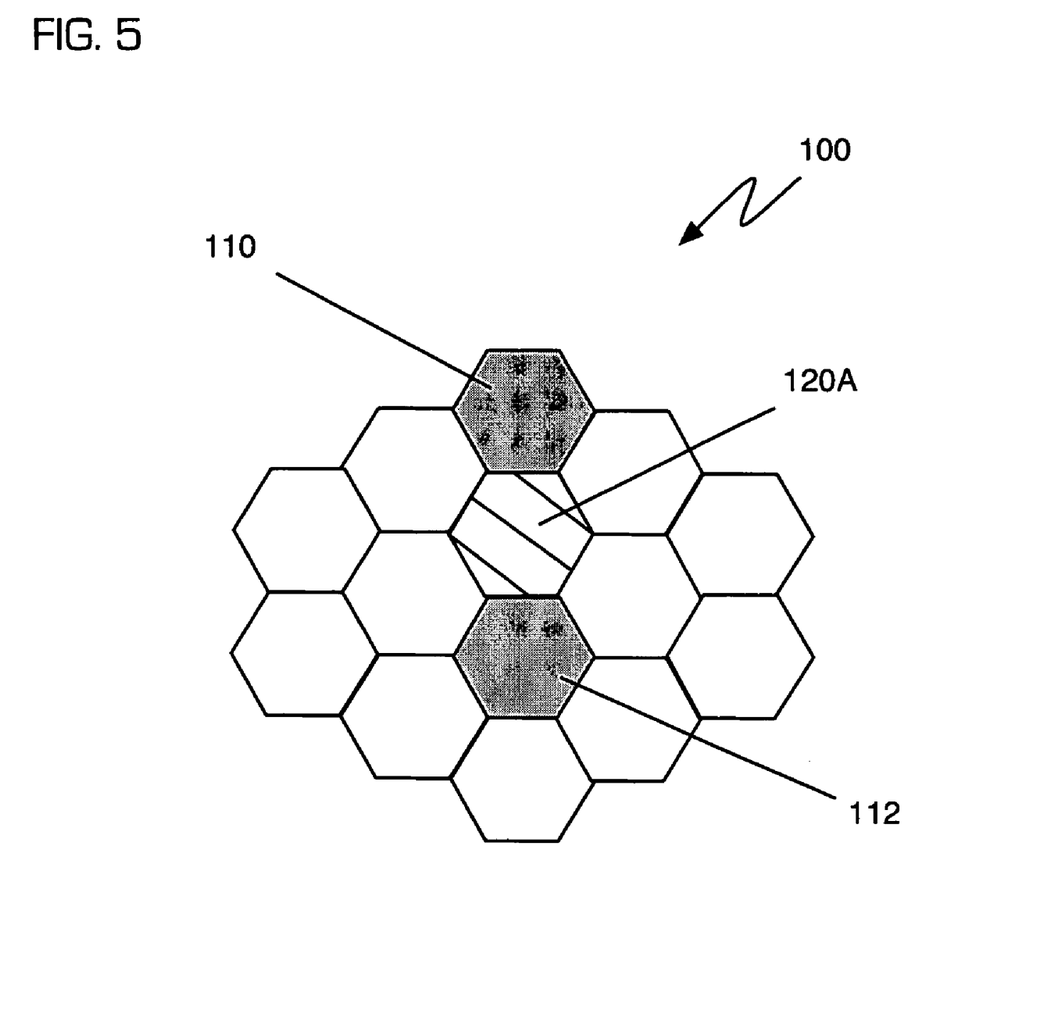
Figure 6:
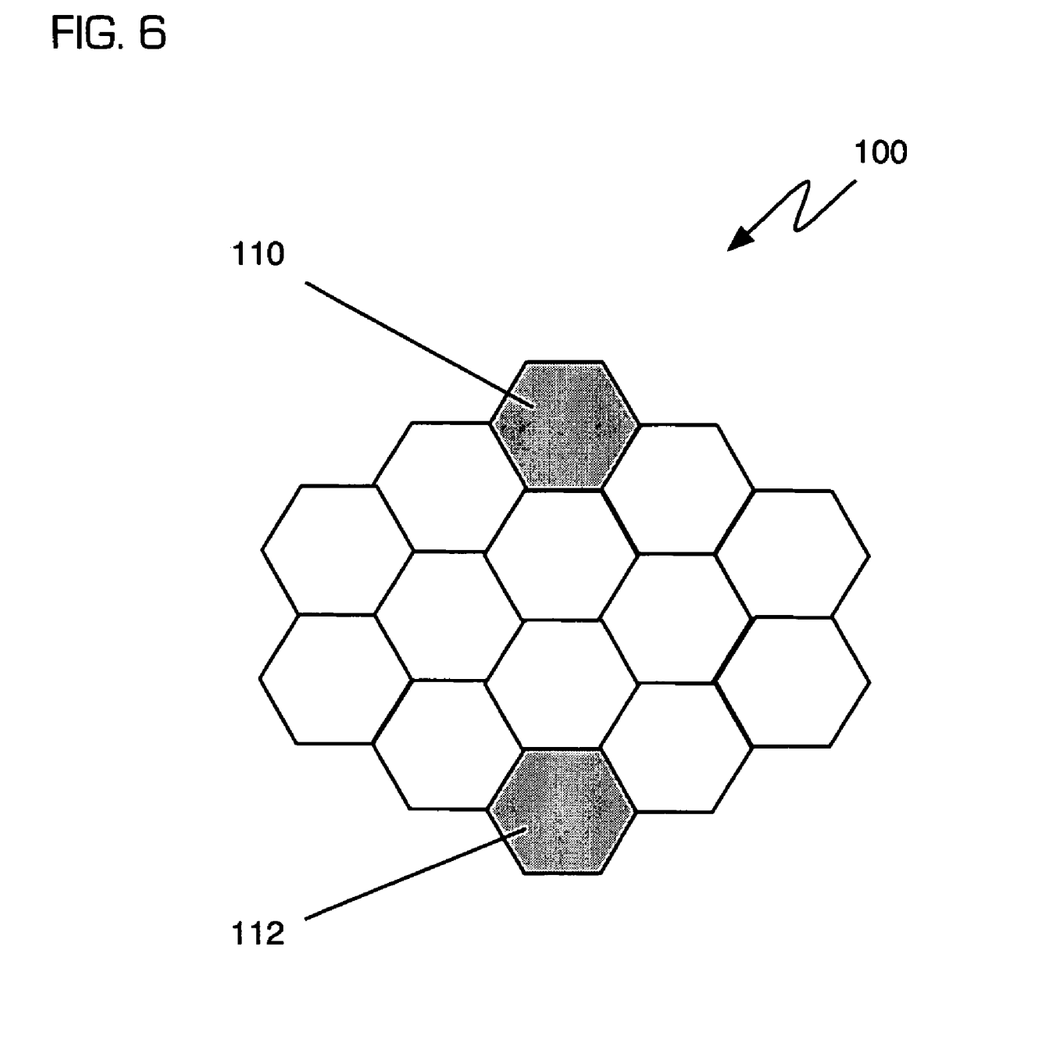

FIGS. 3–6 each show grid 100 and a relationship between two distinct cells of interest (i.e., 110, 112). In FIG. 3, the first cell of interest 110 is located immediately adjacent to the second cell of interest 112. As such, each cell of interest 110, 112 shares four common first degree neighboring cells with the other: its own cell (i.e., 110 or 112), the other cell of interest (i.e., 112 or 110), and the two first degree neighboring cells that both share (i.e., 120A and 120B). Similarly, in FIG. 4, each cell of interest 110, 112 shares two common first degree neighboring cells, 120A and 120B. However, here, the two cells of interest 110, 112 are not first degree neighboring cells of each other. Accordingly, in FIG. 4, the cells of interest 110, 112 share only two first degree neighboring cells. In FIG. 5, the cells of interest 110, 112 share only one common first degree neighboring cell, 120A. In FIG. 6, the cells of interest 110, 112 share no common first degree neighboring cells.

These relationships between cells of interest provide a useful way of modeling spatially-correlated variation in a process parameter. Simply put, the closer two chip components are to each other, the more likely it is that they will share similar characteristics, each having been affected to a similar degree by such spatially-correlated variation. Contrarily, the further apart two components are, the less likely it is that they will have been similarly affected by spatially-correlated variation in a process parameter. As shown in FIGS. 2–6, the number of common neighboring cells shared by cells of interest (e.g., cells containing gates) is related to a distance between those cells.

Physical parameters exhibiting spatial correlation such as effective transistor channel length are expressed as a linear combination of the grid random variables in such a manner as to represent as closely as possible the user-provided spatial correlation profile shown in FIG. 1. Details of a preferred method of choosing the coefficients of the linear combination are provided below.

Figure 7:
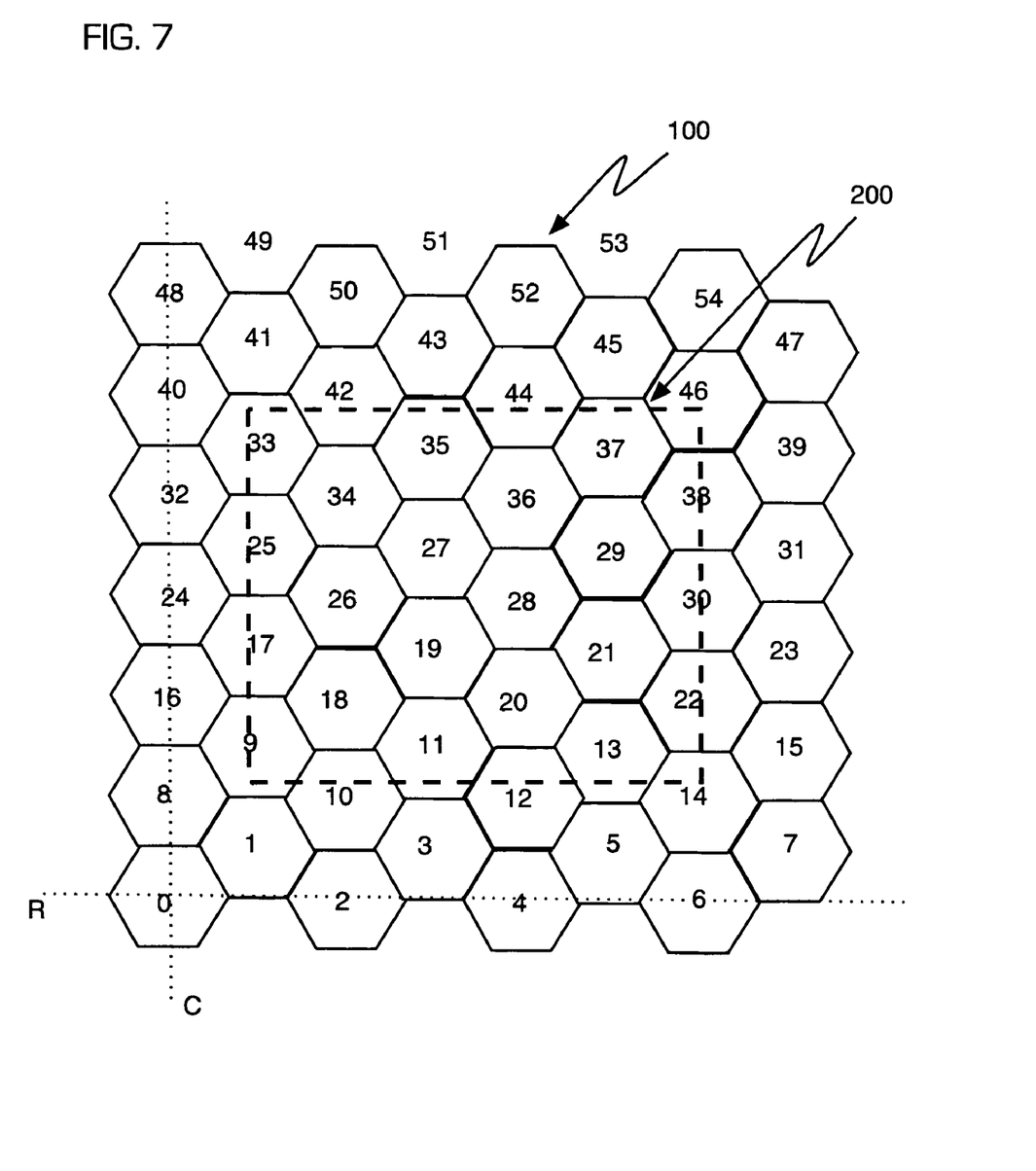
FIG. 7 shows an indexed hexagonal grid pattern overlaid on a chip area.

Referring now to FIG. 7, a grid 100 of hexagonal cells is shown superposed atop a chip area 200. Each cell is indexed to permit its individual identification. Additional benefits of such indexing will be described below. Grid 100 is slightly larger than chip area 200, such that grid 100 contains all first degree neighboring cells of each cell falling, entirely or in part, within chip area 200. More or fewer cells may similarly be provided without departing from the scope of the present invention. The cells of grid 100 are arranged in columns C and rows R, although other arrangements are also possible.

Spatial correlation in process parameter variation may be modeled using a grid such as that in FIG. 7. To do so, an independent random variable is first associated with each cell of grid 100. Next, the variation in a process parameter $\Delta A$ is expressed as a linear combination of the random variables associated with a cell of interest and its neighboring cells, according to the following equation:

$$\Delta A = a_G \Delta X_G + a_r \Delta X_r + a_{sd} \Delta X_c + a_{ld}(\Delta X_{n,1} + \Delta X_{n,2} + \Delta X_{n,3} + \Delta X_{n,4} + \Delta X_{n,5} + \Delta X_{n,6})$$ (Eq. 1)

where $a_G$ is the sensitivity of the process parameter to global variation, $\Delta X_G$ is the random variable modeling the global variation, $a_r$ is the sensitivity of the process parameter to independent variation, $\Delta X_r$ is the random variable modeling the independent variation, $a_{sd}$ is the sensitivity of the process parameter to short distance spatial variation, $\Delta X_c$ is the random variable associated with the cell of interest, $a_{ld}$ is the sensitivity of the process parameter to long distance spatial variation, and $\Delta X_{n,1}$ through $\Delta X_{n,6}$ are the random variables associated with the first degree neighboring cells of the cell of interest. As noted above, methods of modeling and accommodating global and independent variation are known in the art and will not be further discussed.

Still referring to FIG. 7, the following example will illustrate the use of Equation 1, above, in the expression of spatially-correlated variation in a process parameter affecting chip area 200. In the case that chip area 200 contains a gate (not shown) falling within cell 18 of grid 100, the independent random variable associated with cell 18 is substituted for $\Delta X_c$ and the independent random variables associated with cells 9, 10, 11, 17, 19, and 26 are substituted for $\Delta X_{n,1}$ through $\Delta X_{n,6}$.

Still referring to FIG. 7, as will be apparent to one having skill in the art, gates in chip area 200 that are closer to the gate in cell 18 are more likely to share commonly neighboring cells with the gate in cell 18 than are gates more distant from the gate in cell 18. For example, in the case that a second gate (not shown) in chip area 200 is located within cell 19, the gates in cells 18 and 19 share a number of commonly neighboring cells. Specifically, they share neighboring cells 11 and 26, as well as their own cells, 18 and 19, for a total of four common neighboring cells, similar to the pattern of FIG. 3. In contrast, if the second gate in chip area 200 is located within cell 28, the two gates will share only one common neighboring cell; cell 19. As will be understood by one skilled in the art, the correlation coefficient computed for two gates by the outputs of Equation 1 is more likely to be larger in the case that the two gates are in cells 18 and 19 than in the case that the two gates are in cells 18 and 28, simply because the equations will contain a greater number of common terms in the first case than in the second.

From Equation 1 we express values of the spatial correlation function through the sensitivity of the process parameter to global variation, the sensitivity of the process parameter to independent variation, the sensitivity of the process parameter to short distance spatial variation, and the sensitivity of the process parameter to long distance spatial variation as follows:

$$\rho(0) = 1 = a_{sd}^2 + 6a_{ld}^2 + a_G^2 + a_r^2$$ (Eq. 2)

$$\rho(0 < d < s) = a_{sd}^2 + 6a_{ld}^2 + a_G^2$$ (Eq. 3)

$$\rho(s < d < 3s) = 2a_{sd}a_{ld} + 2a_{ld}^2 + a_G^2$$ (Eq. 4)

$$\rho(2.31s < d < 4.26s) = 2a_{ld}^2 + a_G^2$$ (Eq. 5)

$$\rho(3s < d < 5s) = a_{ld}^2 + a_G^2$$ (Eq. 6)

$$\rho(5s < d) = a_G^2$$ (Eq. 7)

where d is the distance between two gates in chip area 200 (FIG. 7), s is the radius of the grid cell, and $a_G$, $a_r$, $a_{sd}$, and $a_{ld}$ are the sensitivities to global variation, independent variation, short distance spatial variation, and long distance spatial variation, respectively. Thus, Equation 2 represents the correlation between the spatially correlated parameter for a particular gate and itself, which must be 1.0. Equation 3 represents the case in which both gates are located within the same cell, in which case the correlation coefficient ρ is a function of each of global variation, short distance spatial variation, and long distance spatial variation. In this case, the average distance between the two gates is between 0 and s. Equation 7, on the other hand, represents the case in which the gates share no common neighbors. In this case, the correlation coefficient is a function only of global variation in the process parameter. Equations 3–6 represent cases in which the distances between the gates are intermediate those of Equations 2 and 7.

Figure 8A:
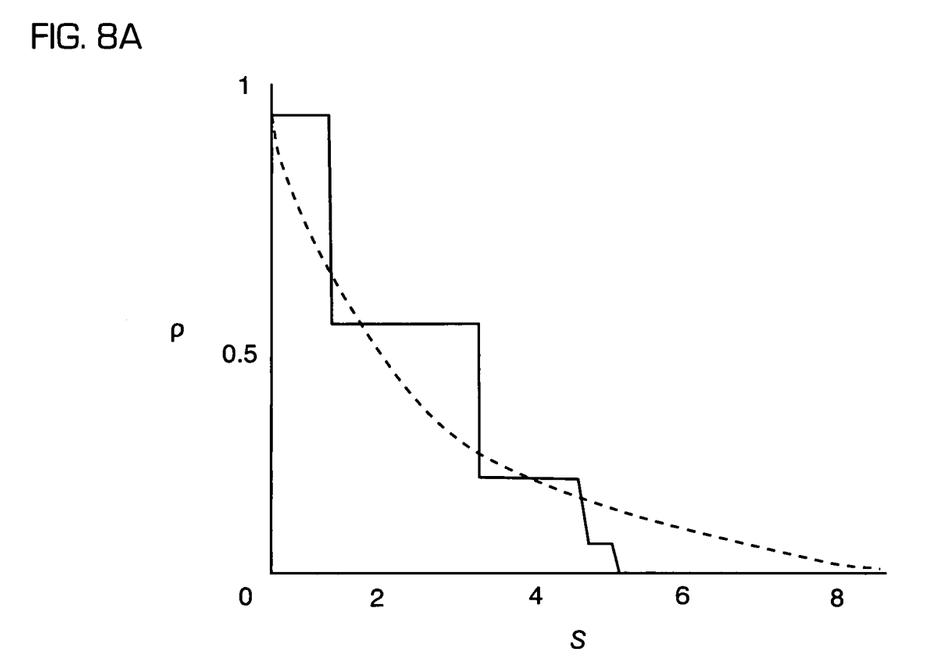
FIGS. 8A–B show exponential and Gaussian correlation functions, respectively, approximated according to the invention.
Figure 8B:
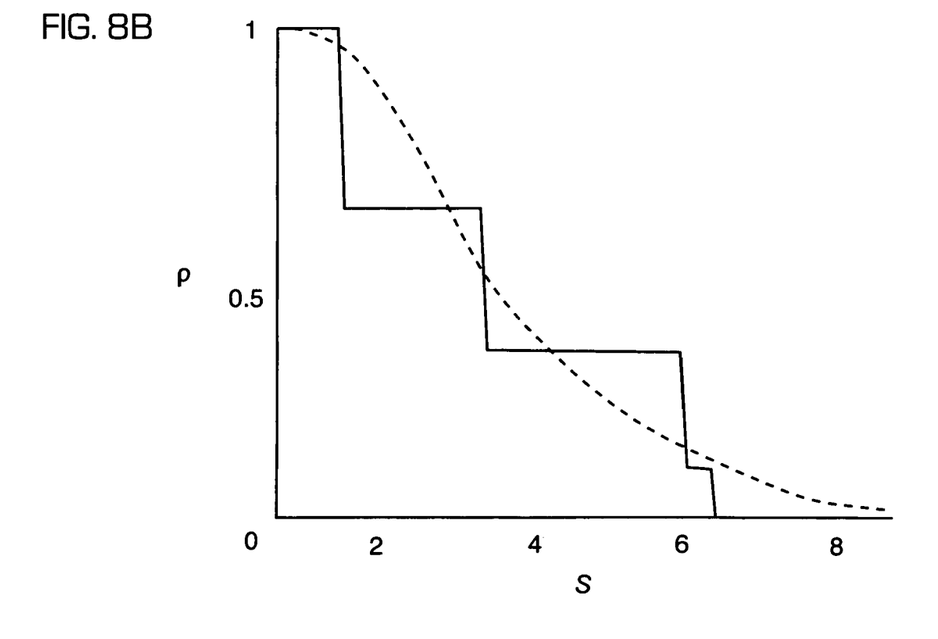

Using Equations 2–7 and selecting proper values for s, $a_G$, $a_r$, $a_{sd}$, and $a_{ld}$, it is possible to approximate any correlation function. Coefficients $a_G$ and $a_r$ are computed directly from the values of the correlation function at distances of zero and infinity. The ratio $a_{ld}/a_{sd}$ and s are then computed by minimizing the quadratic error of the approximation. FIGS. 8A–B show exponential and Gaussian correlation functions, respectively, approximated by this technique. As would be recognized by one having skill in the art, other methods of approximation are possible and within the scope of the present invention.

As described herein, only first degree neighboring cells are included in calculations such as those above. Including additional neighboring cells (i.e., second degree, third degree, etc.) increases the accuracy of such calculations, but also significantly increases their complexity and computing cost. Nevertheless, the inclusion of such additional neighboring cells may be desirable in some circumstances and is within the scope of the present invention.

Substituting the computed values for s, $a_G$, $a_r$, $a_{sd}$, and $a_{ld}$, back into Equation 1 we obtain the parameterized model of the spatially correlated parameter, expressed through the random variable modeling the global variation $\Delta X_G$, the random variable modeling the independent variation $\Delta X_r$, the random variable associated with the cell of interest $\Delta X_c$, and the random variables associated with the first degree neighboring cells of the cell of interest $\Delta X_{n,1}$ through $\Delta X_{n,6}$. Substituting this model into the gate delay model for the spatially correlated parameter, we obtain the gate delay model expressed as a function of independent sources of variation in such a manner that it correctly models spatial variation of its spatially correlated parameter. As it is known from prior art, the gate delay model expressed through independent source of variation is suitable for parameterized SSTA.

As is known in the art, SSTA generally includes at least three input values: (1) a circuit netlist, (2) timing assertions and (3) parameterized delay models expressed through independent Gaussian sources of variations. With respect to the present invention, the first, second, are assumed to be known or determinable. The third input is computed from the given parameterized gate delay model expressed through spatially correlated parameters and the given correlation functions of the spatially correlated parameters, as is described above in accordance with this invention.

Returning to FIG. 7, the indexing scheme shown is convenient for quickly determining the index of a cell of interest (e.g., a cell containing a gate), given the coordinates and indices of neighboring cells. For this reason, it is convenient to view grid 100 as comprising horizontal rows R and vertical columns C of hexagonal cells. If the number of cells in each row (i.e., eight) is denoted as $n_r$, then each row of cells begins with a cell numbered 0, $n_r$, $2n_r$, $3n_r$, etc.

Figure 9A:
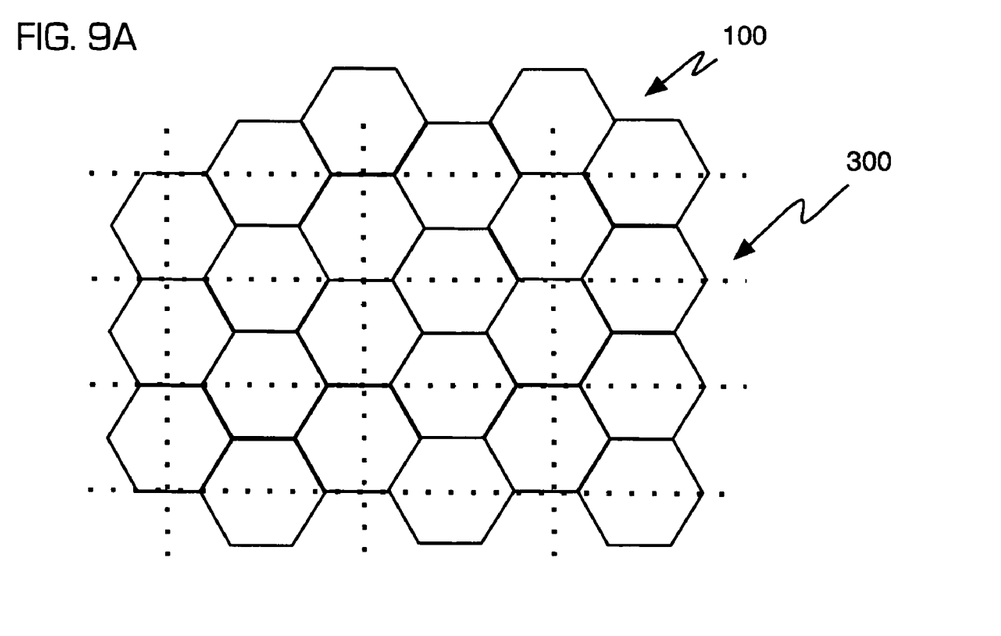
FIGS. 9A–B show general and detailed views, respectively, of a chip area overlaid with hexagonal and rectangular grids.
Figure 9B:
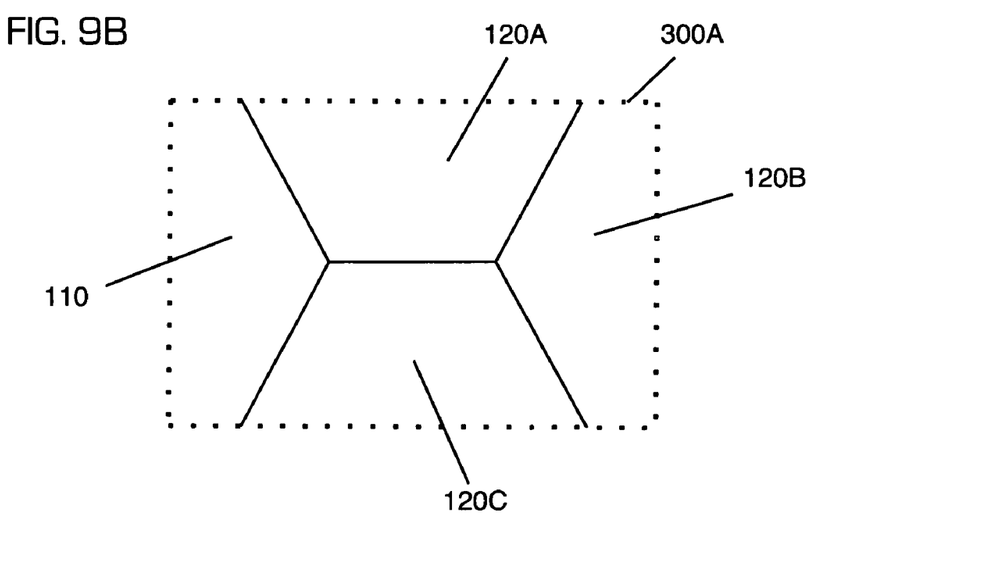

Referring to FIGS. 9A–B, it is possible to construct an algorithm for computing the index of a cell of interest by constructing a rectangular grid 300 overlaying hexagonal grid 100, such that each rectangular cell of rectangular grid 300 encloses four halves of four hexagonal cells. Taking an individual rectangular cell 300A, as shown in FIG. 9B, it is possible to compute the index of a hexagonal cell of interest 110. To do so, the horizontal and vertical indices of rectangular cell 300A are first calculated from the horizontal and vertical periods of rectangular grid 300. Next, index i of the left hexagonal cell 110 is computed using the following formula:

$$i = i_{vr} \times n_r + 2 \times i_h \quad \text{(Eq. 8)}$$

where $i_{vr}$ and $i_h$ are the vertical and horizontal indices, respectively, of rectangular cell 300A and $n_r$ is the number of hexagonal cells in each row of hexagonal grid 100.

Next, the location of a gate or other chip component within rectangular cell 300A is determined by transforming its coordinates in chip area 200 (FIG. 7) to the local coordinates of rectangular cell 300A and comparing the local coordinates to the equations of the lines dividing rectangular cell 300A (i.e., the lines forming the borders of the four hexagonal cells). This allows a determination of which of the four hexagonal cells making up rectangular cell 300A contains the gate or other chip component.

Figure 10A:
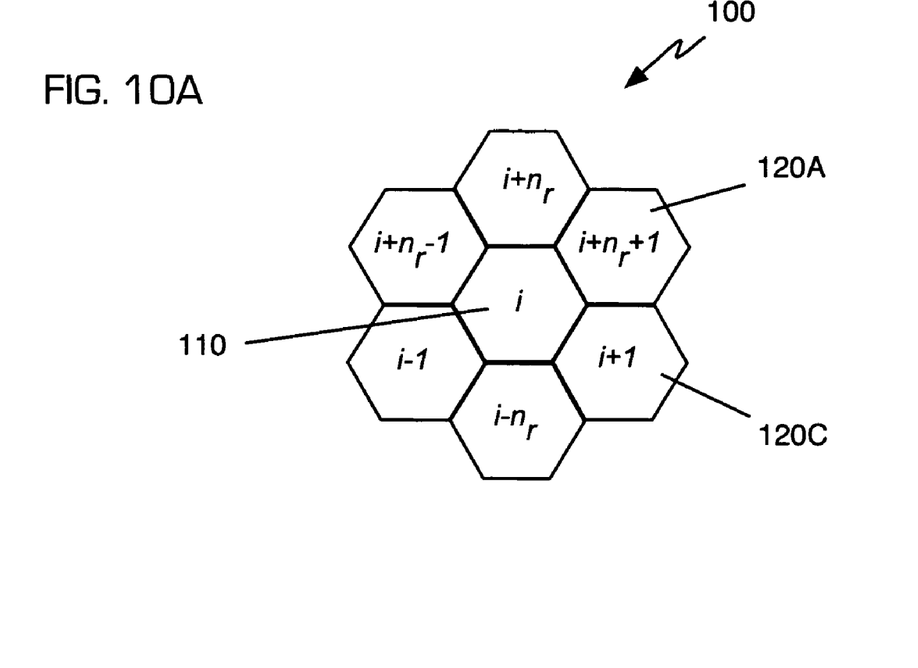
FIGS. 10A–B show indexing patterns for a hexagonal grid.
Figure 10B:
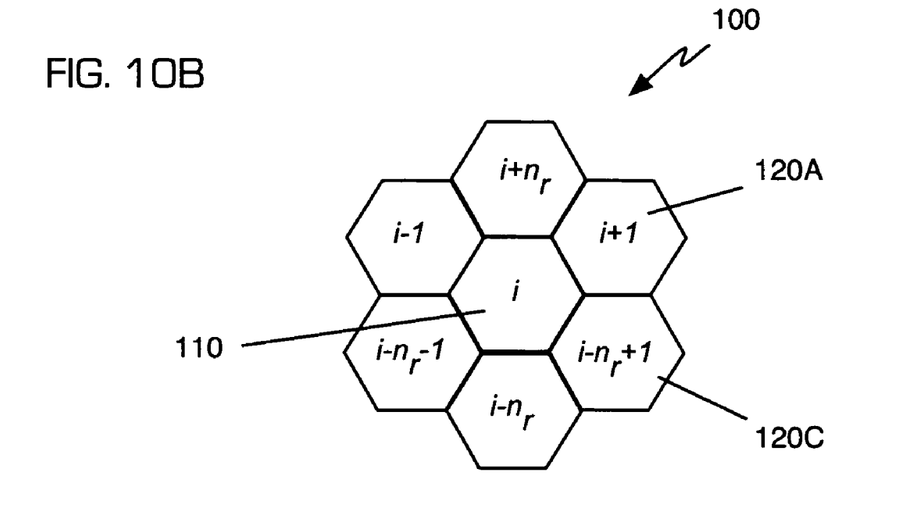

Once the cell of interest 110 (i.e., the hexagonal cell containing the gate or other chip component) is determined, the indices of its neighboring cells must also be determined. However, due to the "zigzagging" nature of the rows of hexagonal grid 100, the method for doing so is different, based on whether the cell of interest 110 is in an odd-numbered or an even-numbered column. Referring now to FIGS. 10A–B, two indexing patterns are shown for hexagonal grid 100. In FIG. 10A, the cell of interest 110 is in an odd-numbered column, i.e., the column C (FIG. 7) begins with an odd number. In such a case, the index of neighboring cell 120A is equal to $i+n_r+1$, where $n_r$ is the number of cells in each row of hexagonal grid 100, as described above. For example, returning to FIG. 7, if the cell of interest 110 is the hexagonal cell having an index of "19," then neighboring cell 120A has an index equal to 19+8+1, or 28. Similarly, neighboring cell 120C has an index equal to 19+1, or 20. The remaining neighboring cells may be indexed according to the indexing pattern of FIG. 10A.

If, however, the cell of interest 110 is in an even-numbered column, the indexing pattern of neighboring cells follows that shown in FIG. 10B. Referring again to FIG. 7, if the cell of interest 110 is the hexagonal cell having an index of "20," then neighboring cell 120A has an index equal to 20+1, or 21. Similarly, neighboring cell 120C has an index equal to 20−8+1, or 13. The remaining neighboring cells may be indexed according to the indexing pattern of FIG. 10B.

Figure 11:
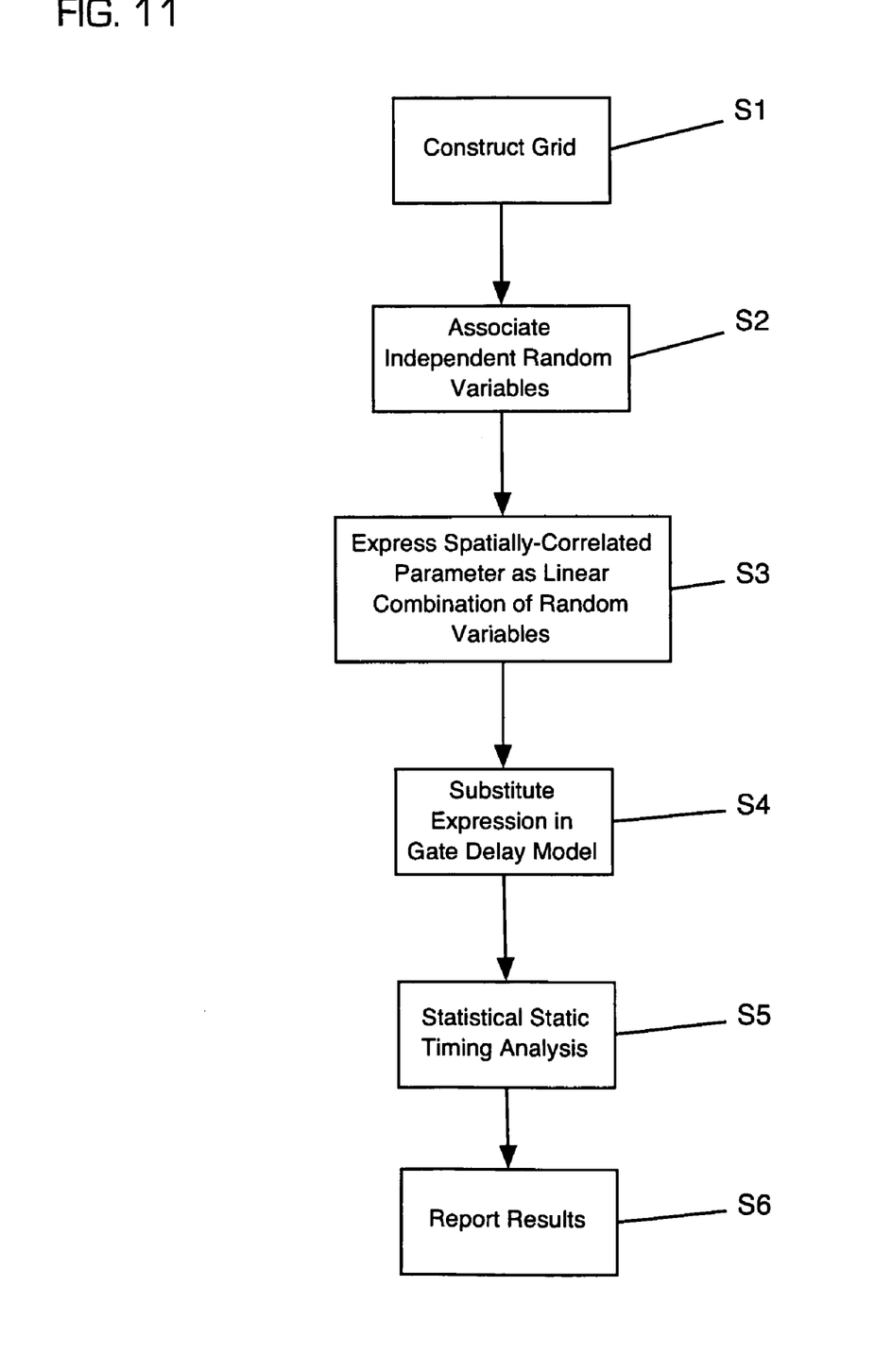
FIG. 11 shows a flow diagram of an illustrative method according to the invention.

Referring now to FIG. 11, a flow diagram is shown of an illustrative method according to the invention. Each step of the illustrated method is described above. First, at step S1, a grid 100 (FIG. 2) is constructed over a chip area 200 (FIG. 7). As explained above, grid 100 may include cells of any number of shapes, a hexagonal shape being preferred. Next, at step S2, an independent random variable is associated with each cell of grid 100. At step S3, a spatially-correlated process parameter is expressed as a linear combination of the random variables of a cell of interest (e.g., a cell containing a gate), its neighboring cells, global variation and independently random variation, according to Equation 1, above. The coefficients of the linear combination are computed in such a manner as to approximate the user-provided spatial correlation function (FIG. 1). As explained above, neighboring cells of any degree may be used, with the use of only first degree neighboring cells being preferred. The use of more distant neighboring cells provides some increase in accuracy, but with a corresponding increase in computational complexity and expense. Next, at step S4, the expression(s) calculated at step S3 are substituted into a gate delay model. Any known or later-developed gate delay model may be employed at step S4, a first-order gate delay model being preferred. A particularly preferred first-order gate delay model may be expressed according to the following equation:

$$D = a_0 + \sum_{i=1}^{n} a_i \cdot \Delta X_i + a_{n+1} \Delta R_a,\qquad \text{(Eq. 9)}$$

where $a_0$ is the mean value of the gate delay, $\Delta X_i$ is the variation of parameter $X_i$, equal to $X_i - x_{i,0}$, where $x_{i,0}$ is the mean value of $X_i$, $a_i$ is the sensitivity of the gate delay to the parameter variation $\Delta X_i$, $\Delta R_a$ is a random variable responsible for uncorrelated variation of the gate delay, and an $a_{n+1}$, is the sensitivity of the gate delay to uncorrelated variations $\Delta R_a$. One or more parameters $\Delta X_i$ may be spatially correlated, each according to a user-provided spatial correlation function. In the case of multiple spatially correlated parameters, there is no requirement that their respective grid shapes or grid sizes be the same. At step S5, statistical static timing analysis is performed according to known methods, in terms of independent random variables only, and the timing results produced in terms of these independent random variables. Finally, at step S6, timing results are reported back to the user or the calling program by transforming results back to being in terms of the original (physical) spatially correlated parameters by simply taking the sum of the squares of the sensitivities of timing results with respect to the grid random variables and global random variable of this parameter in accordance with the equation below:

$$\text{Timing result} = \text{mean} + a_0 \Delta X_c + \sum_{i=1}^{n} a_i \Delta X_{gi} + \text{other parameters} + \ldots \qquad \text{(Eq. }$$

$$= \text{mean} + \left(a_0^2 + \sum_{i=1}^{n} a_i^2\right)^{1/2} \Delta X + \text{other parameters} + \ldots$$

where $a_0$ is the sensitivity to the global random variable $\Delta X_c$, $a_i$ is the sensitivity to the grid random variables $\Delta X_{gi}$ and $\Delta X$ is the original (physical) spatially correlated parameter in terms of which results are reported.

Figure 12:
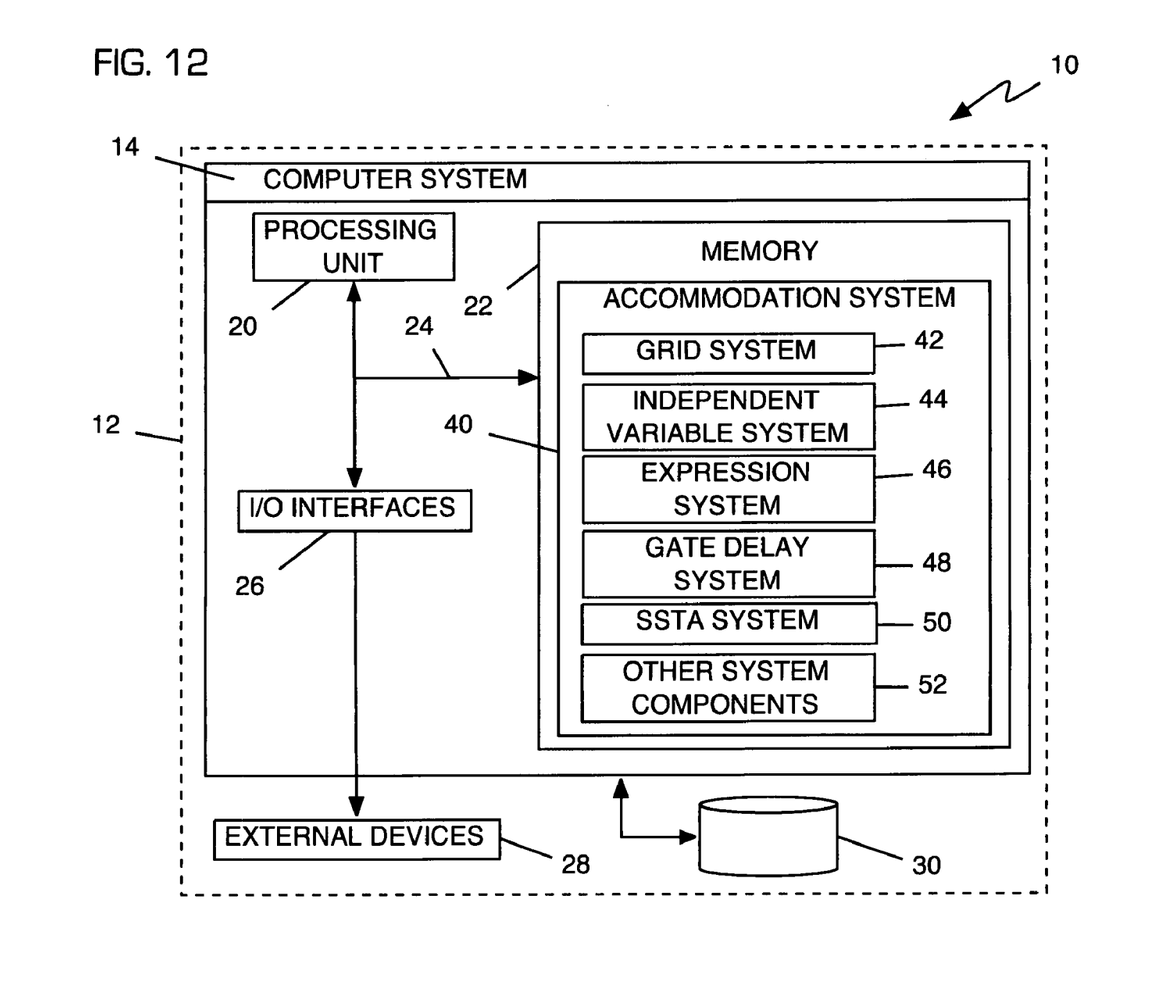
FIG. 12 shows a block diagram of an illustrative system according to the invention.

FIG. 12 shows an illustrative system 10 for accommodating spatially-correlated variation in one or more process parameters during statistical timing of a circuit. To this extent, system 10 includes a computer infrastructure 12 that can perform the various process steps described herein for accommodating spatially-correlated variation in one or more process parameters. In particular, computer infrastructure 12 is shown including a computer system 14 that comprises an accommodation system 40, which enables computer system 14 to accommodate spatially-correlated variation in one or more process parameters by performing the process steps of the invention.

Computer system 14 is shown including a processing unit 20, a memory 22, input/output (I/O) interfaces 26, and a bus 24. Further, computer system 14 is shown in communication with external devices 28 and a storage system 30. As is known in the art, in general, processing unit 20 executes computer program code, such as accommodation system 40, that is stored in memory 22 and/or storage system 30. While executing computer program code, processing unit 20 can read and/or write data from/to memory 22, storage system 30, and/or I/O interfaces 26. Bus 24 provides a communication link between each of the components in computer system 14. External devices 28 can include any device that enables a user (not shown) to interact with computer system 14 or any device that enables computer system 14 to communicate with one or more other computer systems.

In any event, computer system 14 can comprise any general-purpose computing article of manufacture capable of executing computer program code installed by a user (e.g., a personal computer, server, handheld device, etc.). However, it is understood that computer system 14 and accommodation system 40 are only representative of various possible computer systems that may perform the various process steps of the invention. To this extent, in other embodiments, computer system 14 can comprise any specific purpose computing article of manufacture comprising hardware and/or computer program code for performing specific functions, any computing article of manufacture that comprises a combination of specific purpose and general purpose hardware/software, or the like. In each case, the program code and hardware can be created using standard programming and engineering techniques, respectively.

Similarly, computer infrastructure 12 is only illustrative of various types of computer infrastructures for implementing the invention. For example, in one embodiment, computer infrastructure 12 comprises two or more computer systems (e.g., a server cluster) that communicate over any type of wired and/or wireless communications link, such as a network, a shared memory, or the like, to perform the various process steps of the invention. When the communications link comprises a network, the network can comprise any combination of one or more types of networks (e.g., the Internet, a wide area network, a local area network, a virtual private network, etc.). Regardless, communications between the computer systems may utilize any combination of various types of transmission techniques.

As discussed above, accommodation system 40 enables computer system 14 to accommodate spatially-correlated variation in one or more process parameters during statistical timing of a circuit. To this extent, accommodation system 40 is shown including a grid system 42, an independent variable system 44, an expression system 46, a gate delay system 48, and a statistical static timing analysis (SSTA) system 50. The operation of each of these systems is described above. Other system components 52 may also be included in accommodation system 40. These may include any component capable of adding additional functionality to accommodation system 40 and/or computer infrastructure 12. However, it is understood that some of the various systems shown in FIG. 12 can be implemented independently, combined, and/or stored in memory for one or more separate computer systems 14 that communicate over a network. Further, it is understood that some of the systems and/or functionality may not be implemented, or additional systems and/or functionality may be included as part of system 10.

While shown and described herein as a method and system for accommodating spatially-correlated variation in one or more process parameters, it is understood that the invention further provides various alternative embodiments. For example, in one embodiment, the invention provides a computer-readable medium that includes computer program code to enable a computer infrastructure to accommodate spatially-correlated variation in one or more process parameters. To this extent, the computer-readable medium includes program code, such as accommodation system 40, that implements each of the various process steps of the invention. It is understood that the term "computer-readable medium" comprises one or more of any type of physical embodiment of the program code. In particular, the computer-readable medium can comprise program code embodied on one or more portable storage articles of manufacture (e.g., a compact disc, a magnetic disk, a tape, etc.), on one or more data storage portions of a computer system, such as memory 22 and/or storage system 30 (e.g., a fixed disk, a read-only memory, a random access memory, a cache memory, etc.), and/or as a data signal traveling over a network (e.g., during a wired/wireless electronic distribution of the program code).

In another embodiment, the invention provides a business method that performs the process steps of the invention on a subscription, advertising, and/or fee basis. That is, a service provider could offer to accommodate spatially-correlated variation in one or more process parameters, as described above. In this case, the service provider can create, maintain, support, etc., a computer infrastructure, such as computer infrastructure 12, that performs the process steps of the invention for one or more customers. In return, the service provider can receive payment from the customer(s) under a subscription and/or fee agreement and/or the service provider can receive payment from the sale of advertising space to one or more third parties.

In still another embodiment, the invention provides a method of generating a system for accommodating spatially-correlated variation in one or more process parameters. In this case, a computer infrastructure, such as computer infrastructure 12, can be obtained (e.g., created, maintained, having made available to, etc.) and one or more systems for performing the process steps of the invention can be obtained (e.g., created, purchased, used, modified, etc.) and deployed to the computer infrastructure. To this extent, the deployment of each system can comprise one or more of (1) installing program code on a computer system, such as computer system 14, from a computer-readable medium; (2) adding one or more computer systems to the computer infrastructure; and (3) incorporating and/or modifying one or more existing systems of the computer infrastructure, to enable the computer infrastructure to perform the process steps of the invention.

As used herein, it is understood that the terms "program code" and "computer program code" are synonymous and mean any expression, in any language, code or notation, of a set of instructions intended to cause a computer system having an information processing capability to perform a particular function either directly or after either or both of the following: (a) conversion to another language, code or notation; and (b) reproduction in a different material form. To this extent, program code can be embodied as one or more types of program products, such as an application/software program, component software/a library of functions, an operating system, a basic I/O system/driver for a particular computing and/or I/O device, and the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method for accommodating spatially-correlated variation in a process parameter during statistical timing of a circuit, the method comprising:
dividing an area of the circuit into a plurality of grid cells;
associating an independent random variable with each of the plurality of grid cells;
expressing at least one spatially-correlated parameter of a first grid cell as a function of the random variables associated with the first grid cell and at least one neighboring grid cell, wherein the function is expressed as:

$$\Delta A = a_G \Delta X_G + a_r \Delta X_r + a_{sd} \Delta X_c + a_{ld}(\Delta X_{n,1} + \Delta X_{n,2} + \Delta X_{n,3} + \Delta X_{n,4} + \Delta X_{n,5} + \Delta X_{n,6}),$$

wherein $a_G$ is a sensitivity of the process parameter to global variation, $\Delta X_G$ is a random variable modeling global variation, $a_r$ is a sensitivity of the process parameter to independent variation, $\Delta X_r$ is a random variable modeling the independent variation, $a_{sd}$ is a sensitivity of the process parameter to short distance spatial variation, $\Delta X_c$ is a random variable associated with the first grid cell, $a_{ld}$ is a sensitivity of the process parameter to long distance spatial variation, and $\Delta X_{n,1}$ through $\Delta X_{n,6}$ are random variables associated with neighboring cells of the first grid cell; and
reporting a result of a statistical static timing analysis using the function.

2. The method of claim 1, wherein at least one grid cell includes a hexagonal shape.

3. The method of claim 1, further comprising the step of:
substituting in a gate delay model at least one expression of the at least one spatially-correlated parameter.

4. The method of claim 3, wherein the gate delay model is expressed as:

$$D = a_0 + \sum_{i=1}^{n} a_i \cdot \Delta X_i + a_{n+1} \Delta R_a,$$

wherein $a_0$ is a mean value of the gate delay, $\Delta X_i$ is a variation of a parameter $X_i$, equal to $X_i - x_{i,0}$, where $x_{i,0}$ is a mean value of $X_i$, $a_i$ is a sensitivity of the gate delay to the parameter variation $\Delta X_i$, $\Delta R_a$ is a random variable responsible for uncorrelated variation of the gate delay, and $a_{n+1}$, is a sensitivity of the gate delay to uncorrelated variations $\Delta R_a$.

5. The method of claim 1, further comprising the step of:
conducting a statistical timing based on the independent random variables.

6. The method of claim 5, wherein the statistical timing includes at least one of the following: an early timing analysis, a late timing analysis, a timing analysis of a combinational circuit, and a timing analysis of a sequential circuit.

7. The method of claim 1, wherein the function of the random variables includes at least one coefficient and wherein the function approximates a spatial correlation function provided by a user.

8. A system for accommodating spatially-correlated variation in a process parameter during statistical timing of a circuit, the system comprising:
a system for dividing an area of the circuit into a plurality of grid cells;
a system for associating an independent random variable with each of the plurality of grid cells;
a system for expressing at least one spatially-correlated parameter of a first grid cell as a function of the random variables associated with the first grid cell and at least one neighboring grid cell, wherein the function is expressed as:

$$\Delta A = a_G \Delta X_G + a_r \Delta X_r + a_{sd} \Delta X_c + a_{ld}(\Delta X_{n,1} + \Delta X_{n,2} + \Delta X_{n,3} + \Delta X_{n,4} + \Delta X_{n,5} + \Delta X_{n,6}),$$

wherein $a_G$ is a sensitivity of the process parameter to global variation, $\Delta X_G$ is a random variable modeling global variation, $a_r$ is a sensitivity of the process parameter to independent variation, $\Delta X_r$ is a random variable modeling the independent variation, $a_{sd}$ is a sensitivity of the process parameter to short distance spatial variation, $\Delta X_c$ is a random variable associated with the first grid cell, $a_{ld}$ is a sensitivity of the process parameter to long distance spatial variation, and $\Delta X_{n,1}$ through $\Delta X_{n,6}$ are random variables associated with neighboring cells of the first grid cell; and a system for reporting a result of a statistical static timing analysis using the function.

9. The system of claim 8, further comprising:
a system for substituting in a gate delay model at least one expression of the at least one spatially-correlated parameter.

10. The system of claim 9, wherein the gate delay model is expressed as:

$$D = a_0 + \sum_{i=1}^{n} a_i \cdot \Delta X_i + a_{n+1} \Delta R_a,$$

wherein $a_0$ is a mean value of the gate delay, $\Delta X_i$ is a variation of a parameter $X_i$, equal to $X_i - x_{i,0}$, where $x_{i,0}$ is a mean value of $X_i$, $a_i$ is a sensitivity of the gate delay to the parameter variation $\Delta X_i$, $\Delta R_a$ is a random variable responsible for uncorrelated variation of the gate delay, and $a_{n+1}$, is a sensitivity of the gate delay to uncorrelated variations $\Delta R_a$.

11. The system of claim 8, further comprising:
a system for conducting statistical timing based on the independent random variables.

12. The system of claim 11, wherein the statistical timing includes at least one of the following: an early timing analysis, a late timing analysis, a timing analysis of a combinational circuit, and a timing analysis of a sequential circuit.

13. A program product stored on a computer-readable medium, which when executed, accommodates spatially-correlated variation in a process parameter during statistical timing of a circuit, the program product comprising:
program code for dividing an area of the circuit into a plurality of grid cells;
program code for associating an independent random variable with each of the plurality of grid cells; and
program code for expressing at least one spatially-correlated parameter of a first grid cell as a function of the random variables associated with the first grid cell and at least one neighboring grid cell, wherein the function is expressed as:

$\Delta A = a_G \Delta X_G + a_r \Delta X_r + a_{sd} \Delta X_c + a_{ld}(\Delta X_{n,1} + \Delta X_{n,2} + \Delta X_{n,3} + \Delta X_{n,4} + \Delta X_{n,5} + \Delta X_{n,6})$, wherein $a_G$ is a sensitivity of the process parameter to global variation, $\Delta X_G$ is a random variable modeling global variation, $a_r$ is a sensitivity of the process parameter to independent variation, $\Delta X_r$ is a random variable modeling the independent variation, $a_{sd}$ is a sensitivity of the process parameter to short distance spatial variation, $\Delta X_c$ is a random variable associated with the first grid cell, $a_{ld}$ is a sensitivity of the process parameter to long distance spatial variation, and $\Delta X_{n,1}$ through $\Delta X_{n,6}$ are random variables associated with neighboring cells of the first grid cell.

14. The program product of claim 13, further comprising:
program code for substituting in a gate delay model at least one expression of the at least one spatially-correlated parameter.

15. The program product of claim 14, wherein the gate delay model is expressed as:

$$D = a_0 + \sum_{i=1}^{n} a_i \cdot \Delta X_i + a_{n+1} \Delta R_a,$$

wherein $a_0$ is a mean value of the gate delay, $\Delta X_i$ is a variation of a parameter $X_i$, equal to $X_i - x_{i,0}$, where $x_{i,0}$ is a mean value of $X_i$, $a_i$ is a sensitivity of the gate delay to the parameter variation $\Delta X_i$, $\Delta R_a$ is a random variable responsible for uncorrelated variation of the gate delay, and $a_{n+1}$, is a sensitivity of the gate delay to uncorrelated variations $\Delta R_a$.

16. The program product of claim 13, further comprising:
program code for conducting statistical timing based on the independent random variables, wherein the statistical timing includes at least one of the following: an early timing analysis, a late timing analysis, a timing analysis of a combinational circuit, and a timing analysis of a sequential circuit.

17. A method for deploying an application for accommodating spatially-correlated variation in a process parameter during statistical timing of a circuit, comprising:
providing a computer infrastructure being operable to:
divide an area of the circuit into a plurality of grid cells;
associate an independent random variable with each of the plurality of grid cells; and
express at least one spatially-correlated parameter of a first grid cell as a function of the random variables associated with the first grid cell and at least one neighboring grid cell, wherein the function is expressed as:

$\Delta A = a_G \Delta X_G + a_r \Delta X_r + a_{sd} \Delta X_c + a_{ld}(\Delta X_{n,1} + \Delta X_{n,2} + \Delta X_{n,3} + \Delta X_{n,4} + \Delta X_{n,5} + \Delta X_{n,6})$, wherein $a_G$ is a sensitivity of the process parameter to global variation, $\Delta X_G$ is a random variable modeling global variation, $a_r$ is a sensitivity of the process parameter to independent variation, $\Delta X_r$ is a random variable modeling the independent variation, $a_{sd}$ is a sensitivity of the process parameter to short distance spatial variation, $\Delta X_c$ is a random variable associated with the first grid cell, $a_{ld}$ is a sensitivity of the process parameter to long distance spatial variation, and $\Delta X_{n,1}$ through $\Delta X_{n,6}$ are random variables associated with neighboring cells of the first grid cell; and
report a result of a statistical static timing analysis using the function.

* * * * *